United States Patent
Mehta et al.

(10) Patent No.: US 7,384,861 B2
(45) Date of Patent: Jun. 10, 2008

(54) STRAIN MODULATION EMPLOYING PROCESS TECHNIQUES FOR CMOS TECHNOLOGIES

(75) Inventors: Narendra Singh Mehta, Dallas, TX (US); Wayne Anthony Bather, Richardson, TX (US); Ajith Varghese, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 280 days.

(21) Appl. No.: 11/183,348

(22) Filed: Jul. 18, 2005

(65) Prior Publication Data
US 2007/0015347 A1 Jan. 18, 2007

(51) Int. Cl.
*H01L 21/425* (2006.01)
(52) U.S. Cl. ............... 438/524; 257/E21.293
(58) Field of Classification Search ........... 438/524; 257/E21.239, E21.293
See application file for complete search history.

(56) References Cited

U.S. PATENT DOCUMENTS

| | | | |
|---|---|---|---|
| 6,621,131 B2 | 9/2003 | Murthy et al. | |
| 6,642,125 B2 | 11/2003 | Oh et al. | |
| 6,900,502 B2 | 5/2005 | Ge et al. | |
| 7,129,187 B2 * | 10/2006 | Joe | 438/769 |
| 2007/0004118 A1 * | 1/2007 | Varghese et al. | 438/199 |

FOREIGN PATENT DOCUMENTS

JP 02133926 A * 5/1990

* cited by examiner

*Primary Examiner*—Bradley K Smith
(74) *Attorney, Agent, or Firm*—Frederick J. Telecky, Jr.; Wade J. Brady, III

(57) ABSTRACT

A method forms a semiconductor device comprising a modifiable strain inducing layer. A semiconductor body is provided. First and second regions of the semiconductor body are identified. A modifiable tensile strain inducing layer is formed over the device within the first and second regions. A mask is then formed that exposes the second region and covers the first region. A material is selected for a modification implant and the selected material is implanted into the second region thereby converting a portion of the modifiable tensile strain inducing layer into a compressive strain inducing layer within the PMOS region.

9 Claims, 14 Drawing Sheets

STRAIN MODULATION EMPLOYING PROCESS TECHNIQUES FOR CMOS TECHNOLOGIES

FIELD OF INVENTION

The present invention relates generally to semiconductor devices and more particularly to methods for fabricating and modulating stress inducing layers for NMOS and PMOS semiconductor devices.

BACKGROUND OF THE INVENTION

It can be appreciated that placing mechanical stresses or strain (e.g., tension or compression) upon a semiconductor substrate can affect the performance of devices formed in and/or on the substrate. With regard to MOS transistors, for example, stressing the substrate can change charge mobility characteristics in respective channel regions of the transistors. This may be beneficial because, for a given electric field developed across the transistors, the amount of current that flows through the channel regions is directly proportional to the mobility of carriers in the channel regions. Thus, the higher the mobility of the carriers in the channel regions, the more rapidly the carriers will pass through the channel regions and the faster the transistors can perform. Improving the mobility of the carriers in the channel regions can also lower operating voltages, which may be desirable at times.

One drawback to improving channel mobility via strain is that compressive strain, which generally improves hole mobility for PMOS devices, can degrade electron mobility, and that tensile strain, which improves electron mobility for silicon substrate based devices, can degrade hole mobility. As a result, introducing tensile strain can improve performance of NMOS devices but degrade performance of PMOS devices. Similarly, introducing compressive strain can improve performance of PMOS devices but degrade performance of NMOS devices. Additionally, the impact of stress on NMOS and PMOS transistor mobility depends upon the channel orientation and surface orientation and is different for different orientations.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device performance, particularly drive current, by fabricating stress inducing layers that can be modulated to selectively yield a different type of stress and/or amount. Compressive type strain/stress improves performance of NMOS devices but degrades performance of PMOS devices. Similarly, tensile type strain/stress improves performance of PMOS devices, but degrades performance of NMOS devices. By fabricating and employing modifiable/modulatable strain inducing layers, different portions of the strain inducing layer can induce varied strain types and/or amounts. Accordingly, compressive type strain can be induced in NMOS channel regions and tensile type strain can be induced into PMOS channel regions with the same strain inducing layer.

In accordance with an aspect of the present invention, a method forms a semiconductor device comprising a modifiable strain inducing layer. A semiconductor body is provided. First and second regions of the semiconductor body are identified. A modifiable tensile strain inducing layer is formed over the device within the first and second regions. A mask is then formed that exposes the second region and covers the first region. A material is selected for a modification implant and the selected material is implanted into the second region thereby converting a portion of the modifiable tensile strain inducing layer into a compressive strain inducing layer within the PMOS region.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
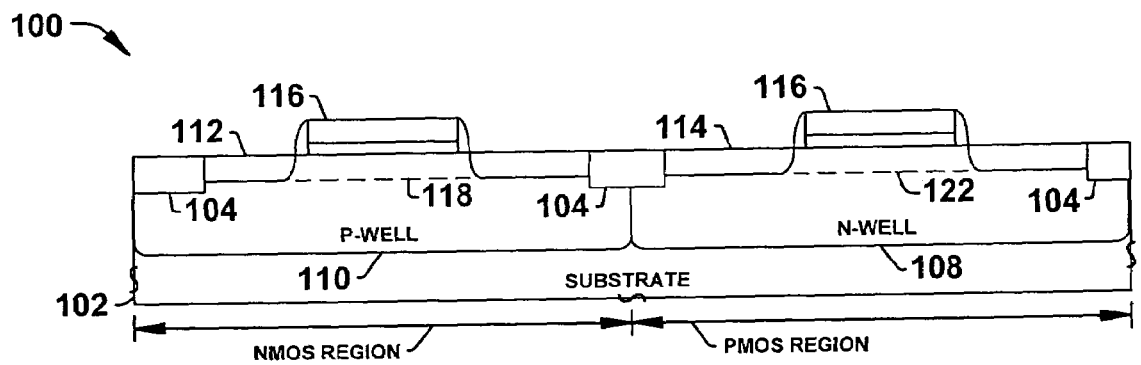
FIG. 1 is a cross sectional view of a conventional CMOS semiconductor device.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

The present invention facilitates semiconductor device performance, particularly drive current, by fabricating strain inducing layers that can be modulated to yield a different type of strain and/or amount. Compressive type strain/strain improves performance of NMOS devices but degrades performance of PMOS devices. Similarly, tensile type strain/strain improves performance of PMOS devices, but degrades performance of NMOS devices. By fabricating and employing modifiable strain inducing layers, different portions of the strain inducing layer can induce varied strain types and/or amounts. Accordingly, compressive type strain can be induced in NMOS channel regions and tensile type strain can be induced into PMOS channel regions with the same strain inducing layer.

It is noted that the terms stress and strain are commonly employed in facilitating channel mobility within transistor devices. The terms stress and strain are intended to and have substantially similar meanings within this application.

FIG. 1 is a cross sectional view of a conventional CMOS semiconductor device 100. The device 100 includes a PMOS region, wherein p-type transistor devices are formed, and an NMOS region, wherein n-type transistor devices are formed. The device 100 is exemplary in nature and is provided to illustrate at least some deficiencies of conventional devices as identified by the inventors of the present invention.

The device 100 includes a semiconductor substrate 102 wherein isolation regions 104 are formed that separate individual devices and the NMOS and PMOS regions. P-type well regions 110 are formed within the NMOS region by implanting p-type dopant(s), such as boron, into the semiconductor substrate 102 within the NMOS region. Similarly, n-type well regions 108 are formed within the PMOS region by implanting n-type dopant(s), such as phosphorous, into the semiconductor substrate 102 within the PMOS region.

Gate stacks 116 comprised of a gate electrode layer formed on a gate dielectric layer and sidewalls are formed in both the NMOS and PMOS regions. The gate electrode layer comprises a conductive material, such as polysilicon and/or metal. The gate dielectric layer comprises a dielectric material, such as silicon dioxide. N-type source/drain regions 112 are formed within the p-type well regions 110 of the NMOS region. The n-type source/drain regions 112 are formed by implanting n-type dopant(s), such as phosphorous, and using the gate stacks 116 to self align the source/drain regions 112. Similarly, p-type source/drain regions 114 are formed within the n-type well regions 108 of the NMOS region. The p-type source/drain regions 114 are formed by implanting p-type dopant(s), such as boron, and using the gate stacks 116 to self align the source/drain regions 114.

Channel regions 118 are defined in the NMOS region and lie underneath the gate stacks 116 and between the source/drain regions 112. Channel regions 122 are defined within the PMOS region and lie underneath the gate stacks 116 and between the source/drain regions 114.

During operation, current is conducted from the source to drain regions when a sufficient voltage, referred to as a threshold voltage, is applied to the gate electrodes. The amount of current that can be conducted is referred to as drive current and is directly related to channel mobility of the channel regions 118 and 122. Generally, channel mobility for NMOS devices relates to electron mobility and channel mobility for PMOS devices relates to hole mobility.

As transistor devices have continuously been scaled (reduced in size), the channel mobility has decreased, and, therefore, the drive current has also decreased. The channel mobility is decreased because of smaller length and shallower channels. This decrease in channel mobility can be a limiting factor for further scale reductions in devices.

Figure 2:
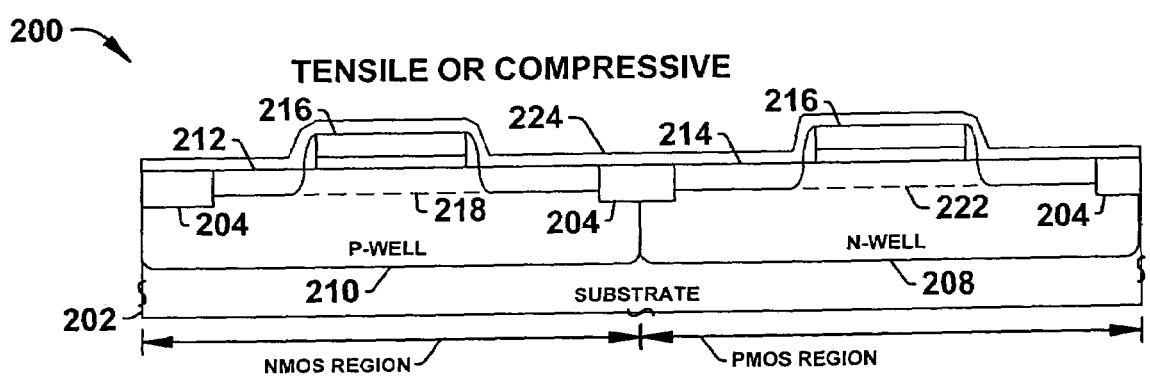
FIG. 2 is another cross sectional view of a conventional CMOS semiconductor device.

Turning now to FIG. 2, another cross sectional view of a conventional CMOS semiconductor device 200 is provided. As with the device 100 of FIG. 1, the device 200 includes a PMOS region, wherein p-type transistor devices are formed, and an NMOS region, wherein n-type transistor devices are formed. A single strain/strain inducing layer is employed to improve channel mobility in one of the regions. The device 200 is exemplary in nature and is provided to illustrate one or more deficiencies of conventional devices as identified by the inventors of the present invention.

The device 200 is substantially similar to the device 100 of FIG. 1. As a result, some description of the device 200 is abbreviated and FIG. 1 and the description thereof should be referenced for further details.

The device 200 includes a semiconductor substrate 202 wherein isolation regions 204 are formed that separate individual devices and the NMOS and PMOS regions. P-type well regions 210 are formed within the NMOS region by implanting p-type dopant(s) into the semiconductor substrate 202 within the NMOS region and n-type well regions 208 are formed within the PMOS region by implanting n-type dopant(s), into the semiconductor substrate 202 within the PMOS region.

Gate stacks 216 comprised of a gate electrode layer formed on a gate dielectric layer and sidewalls are formed in both the NMOS and PMOS regions. N-type source/drain regions 212 are formed within the p-type well regions 210 of the NMOS region. The n-type source/drain regions 212 are formed by implanting n-type dopant(s), such as phosphorous, and using the gate stacks 216 to self align the source/drain regions 212. Similarly, p-type source/drain regions 214 are formed within the n-type well regions 208 of the NMOS region. The p-type source/drain regions 214 are formed by implanting p-type dopant(s), such as boron, and using the gate stacks 216 to self align the source/drain regions 214.

Channel regions 218 are defined in the NMOS region and lie underneath the gate stacks 216 and between the source/drain regions 212. Channel regions 222 are defined within the PMOS region and lie underneath the gate stacks 216 and between the source/drain regions 214.

A strain inducing cap layer 224 is formed over the device 200 to facilitate channel mobility within the channel regions 218 and 222. The strain inducing cap layer 224 comprises a strain inducing material, such as silicon nitride or silicon dioxide, that induces either tensile or compressive strain into both types of channel regions present within the NMOS and PMOS regions. It is noted that inducing tensile strain into channel regions improves electron mobility, but degrades hole mobility. Similarly, inducing compress strain into channel regions improves hole mobility, but degrades electron mobility. As a result, the cap layer 224 can improve performance of either the NMOS or PMOS region, but not both. Additionally, as channel mobility of one region is improved, channel mobility for the other degrades.

Figure 3:
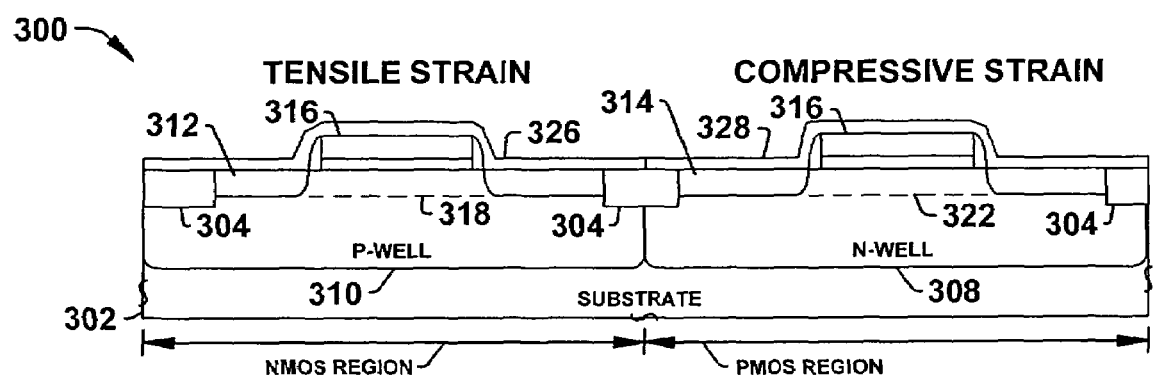
FIG. 3 is yet another cross sectional view of a conventional CMOS semiconductor device.

FIG. 3 is yet another cross sectional view of a conventional CMOS semiconductor device 300. The device 300 includes a PMOS region, wherein p-type transistor devices are formed, and an NMOS region, wherein n-type transistor devices are formed. Separate strain/strain inducing cap layers are employed for the NMOS and PMOS regions. The device 300 is exemplary in nature and is provided to illustrate at least some deficiencies of conventional devices as identified by the inventors of the present invention.

The device 300 is substantially similar to the device 100 of FIG. 1. As a result, some description of the device 300 is abbreviated and FIG. 1 and the description thereof should be referenced for further details.

The device 300 includes a semiconductor substrate 302 wherein isolation regions 304 are formed that separate individual devices and the NMOS and PMOS regions. P-type well regions 310 are formed within the NMOS region by implanting p-type dopant(s), such as boron, into the semiconductor substrate 302 within the NMOS region. Similarly, n-type well regions 308 are formed within the PMOS region by implanting n-type dopant(s), such as phosphorous, into the semiconductor substrate 302 within the PMOS region.

Gate stacks 316 comprised of a gate electrode layer formed on a gate dielectric layer and sidewalls are formed in both the NMOS and PMOS regions. N-type source/drain regions 312 are formed within the p-type well regions 310 of the NMOS region. The n-type source/drain regions 312 are formed by implanting n-type dopant(s), such as phosphorous, and using the gate stacks 316 to self align the source/drain regions 312. Similarly, p-type source/drain regions 314 are formed within the n-type well regions 308 of the NMOS region. The p-type source/drain regions 314 are formed by implanting p-type dopant(s), such as boron, and using the gate stacks 316 to self align the source/drain regions 314.

Channel regions 318 are defined in the NMOS region and lie underneath the gate stacks 316 and between the source/drain regions 312. Channel regions 322 are defined within the PMOS region and lie underneath the gate stacks 316 and between the source/drain regions 314.

An NMOS cap layer 326 is formed over the NMOS region and induces tensile strain into the NMOS channel regions 318. As a result, electron mobility and, therefore, channel mobility is improved. A PMOS cap layer 328 is formed over the PMOS region that induces compressive strain into the PMOS channel regions 322. As a consequence, hole mobility is improved and, as a result, channel mobility is improved. Furthermore, by employing separate cap layers for the NMOS and PMOS region also avoids or mitigates degradation of channel mobility, such as described with respect to FIG. 2.

Employing separate strain inducing cap layers for the NMOS and PMOS region improves channel mobility within both regions. This permits further reductions in device size than possible without. Conventional fabrication techniques require separately formed layers to induce different types of strain. However, extra masks, layers, and processing steps are required in order to form the separate strain inducing layers. These extra masks, layers, and processing steps can be quite costly in terms of time, resources, defects and yield.

Figure 4:
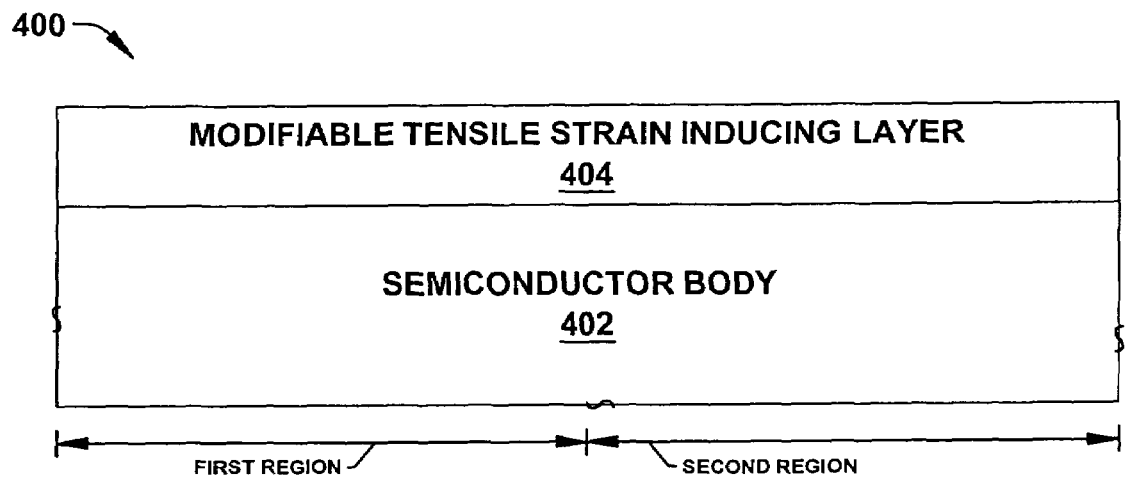
FIG. 4 is a cross sectional view of a semiconductor device in accordance with an aspect of the present invention.
Figure 5:
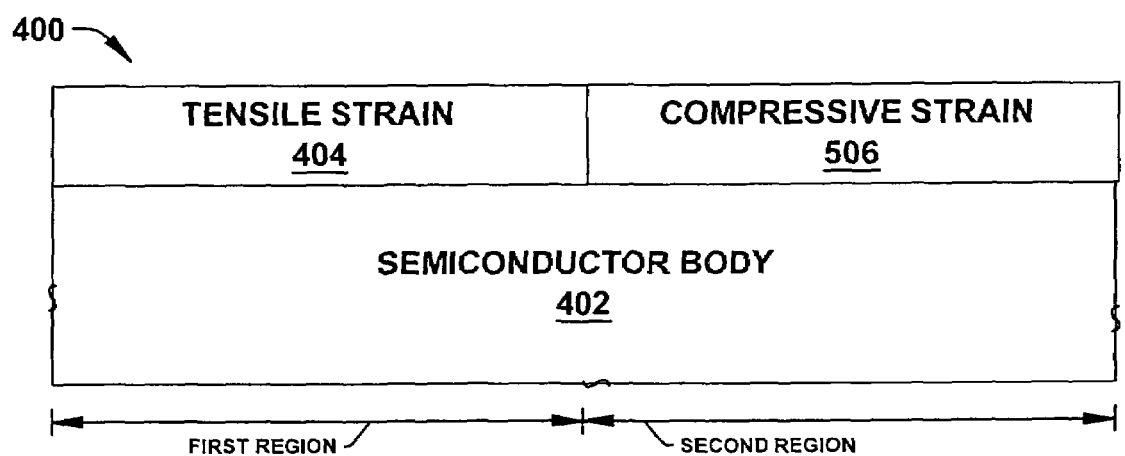
FIG. 5 is another cross sectional view of a semiconductor device in accordance with an aspect of the present invention.

FIGS. 4 and 5 are cross sectional views illustrating a semiconductor device 400 having a modifiable strain inducing layer. The views are provided and described at a high level to facilitate understanding of the present invention.

FIG. 4 is a cross sectional view of the semiconductor device 400 in accordance with an aspect of the present invention. The device 400 includes an NMOS region, wherein n-type transistor devices are formed, and a PMOS region, wherein p-type transistor devices are formed.

A tensile strain inducing layer 404 is formed over or on a semiconductor body 402. The semiconductor body 402 comprises at least a portion of a wafer and one or more semiconductor layers. The semiconductor body 402 can be and/or comprise a semiconductor substrate. The semiconductor body 402 can comprise insulating layers, such as in silicon on insulator and germanium on insulator substrates. Other structures (not shown), such as gate structures and the like, can be formed on the semiconductor body 402.

The tensile strain inducing layer 404 is comprised of silicon nitride and is formed by a suitable formation process that forms the layer 404 as inducing tensile strain to surrounding layers, including the semiconductor body 402. A suitable formation process employs depositing silicon nitride by a bis-tertiarybutylamino-silane (BTBAS) ($C_8H_{22}N_2Si$) process to form a BTBAS based silicon nitride layer as the tensile strain inducing layer 404. Other silicon nitride fabrication processes can be employed that form strain inducing silicon nitride layers as the strain inducing layer 404. As formed in FIG. 4, the tensile strain inducing layer 404 induces tensile strain across both NMOS and PMOS regions.

FIG. 5 is another cross sectional view of the semiconductor device 400 in accordance with an aspect of the present invention. A suitable material, such as argon, is implanted that alters the type and, optionally, amount, of strain produced. The suitable material is implanted in a selected portion of the strain inducing layer 404 causing the selected portion to become a compressive strain inducing layer 506.

Figure 6:
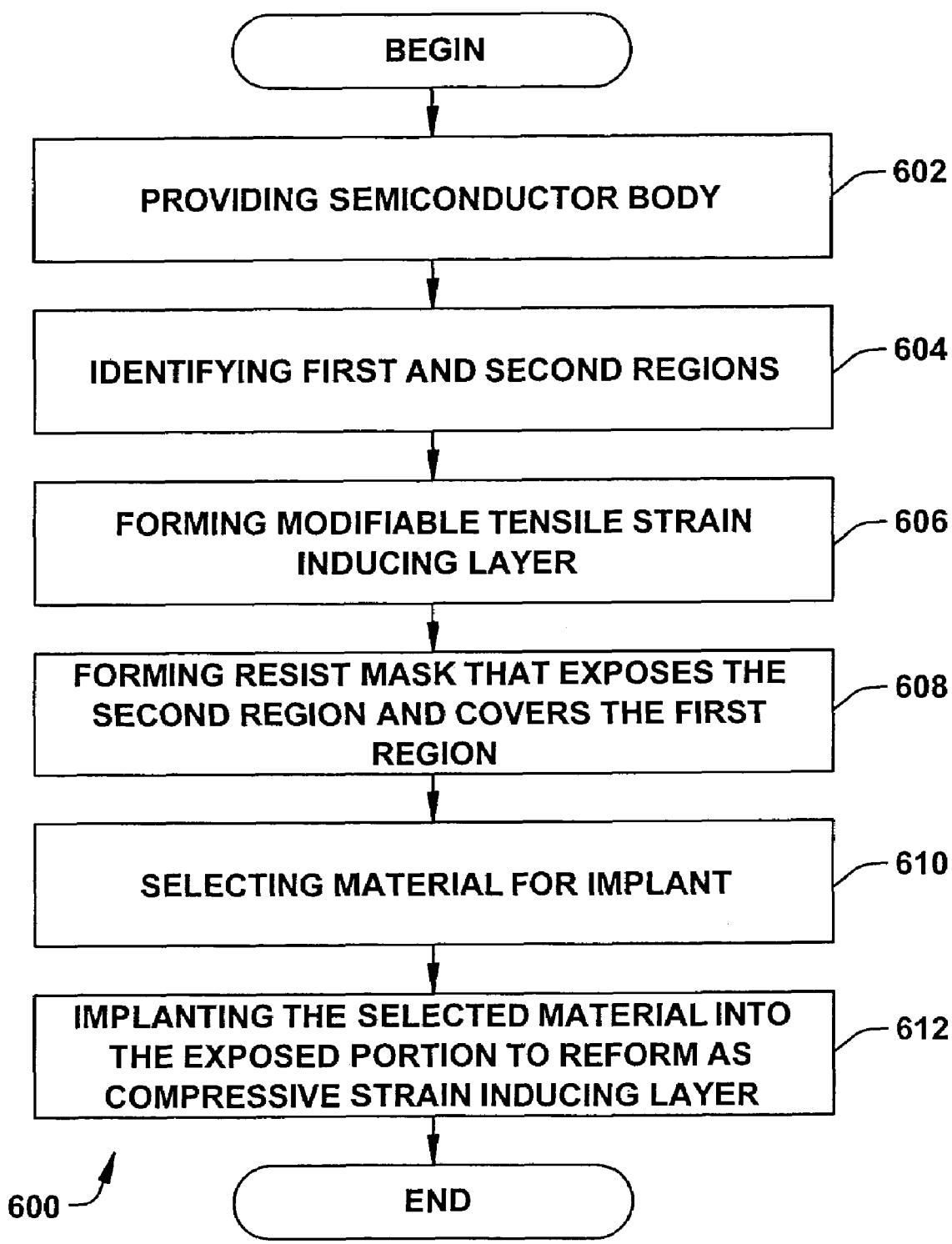
FIG. 6 is a flow diagram illustrating a method of fabricating a semiconductor device having a single strain inducing layer that selectively provides varied types of strain in accordance with an aspect of the present invention.

FIG. 6 is a flow diagram illustrating a method 600 of fabricating a semiconductor device having a single strain inducing layer that selectively provides varied types of strain in accordance with an aspect of the present invention. The method 600 forms the layer with a first type of strain and modifies at least a portion of the layer to provide a different type of strain and/or amount of strain.

The method 600 begins at block 602, wherein a semiconductor body is provided. The semiconductor body includes at least a portion of a wafer (e.g., a wafer die) and can include one or more layers of semiconductor materials, epitaxial layers, insulator layers, and the like. For example, the semiconductor body herein can include one or more layers of silicon, one or more layers of germanium, silicon on insulator (SOI) material, germanium on insulator (GOI) material, and the like.

First and second regions of the device are identified and/or designated at block 604. The first and second regions are typically of different conductivity types, such as n-type and p-type regions. It is appreciated that alternate methods of the present invention are contemplated that include identifying and/or designating more than two regions.

A modifiable tensile strain inducing layer is formed over the semiconductor body by a suitable formation process at block 606. Generally, the strain inducing layer is comprised of silicon nitride and is formed by a process that causes the deposited or formed silicon nitride to induce strain, typically tensile strain. A suitable formation process employs an organic precursor, bis-tertiarybutylamino-silane (BTBAS) ($C_8H_{22}N_2Si$), reacted with ammonia at a low temperature to deposit silicon nitride over the device. The exemplary BTBAS based process forms the silicon nitride layer and causes the layer to induce an amount of tensile strain.

The strain inducing liner can be formed via a number of suitable processes in order to obtain a desired thickness, strain amount, and strain type. One example of a suitable formation process is using NH3 and di-chloro silane in a furnace or single wafer tool. Such nitride trench liners yield tensile stress/strain of about 900 MPa. Another example of a suitable process is growing the nitride trench liner within a furnace or single wafer tool with BTBAS (bis-tetrabutyl amino silane). Typical liner produced by this process yield tensile stress/strain of about 2.0 GPa. Yet another example of a suitable process employs hexa chloro disilane (HCD) and NH3 to form the nitride trench liner. HCD formed nitride liners typically yield about 1.2 GPa. Other suitable nitride formation process can also be employed. By varying and/or controlling the formation processes employed and thickness, a desired or selected compression type and amount for the first region.

A resist mask is formed over the device that exposes the second region and covers the first region at block 608. The resist mask can be formed, for example, by depositing photoresist over the device and removing selective portions via development and washing.

An implant material is selected at block 610 for a subsequent strain modification implant. The implant material is selected according to the formed tensile strain inducing layer and a desired or selected strain type and/or amount. An example of a suitable material is argon, which, when implanted, can alter at least portions of tensile strain inducing layers into compressive strain inducing layers. Other materials that can be employed for the implant material include other inert elements.

The selected material is implanted at block 612 into the second region, which is exposed by the resist mask. The selected material is prevented from being implanted into the first region by the resist mask.

During implantation, the selected material causes the material within the strain inducing layer within the second region to relax. As the material continues to relax due to the implantation of the selected material, the exposed portion of the strain inducing layer changes from inducing tensile type strain to inducing compressive type strain. A dose and energy of the implant are employed along with the selected material to obtain the induced compressive strain and amount of the induced compressive strain.

Accordingly, the single strain inducing layer comprises a tensile strain inducing portion within the first region and a compressive strain inducing portion within the second region. These distinct tensile and compressive strain inducing portions are formed from a single layer and without patterning and etching the strain inducing layer.

Turning now to FIGS. 7A to 7D, a plurality of fragmentary cross section diagrams illustrating a semiconductor device 700 being formed in accordance with the present invention by the method 600 of FIG. 6 are provided. The device 700 is fabricated so as to selectively induce different types of strain within different regions.

Figure 7A:
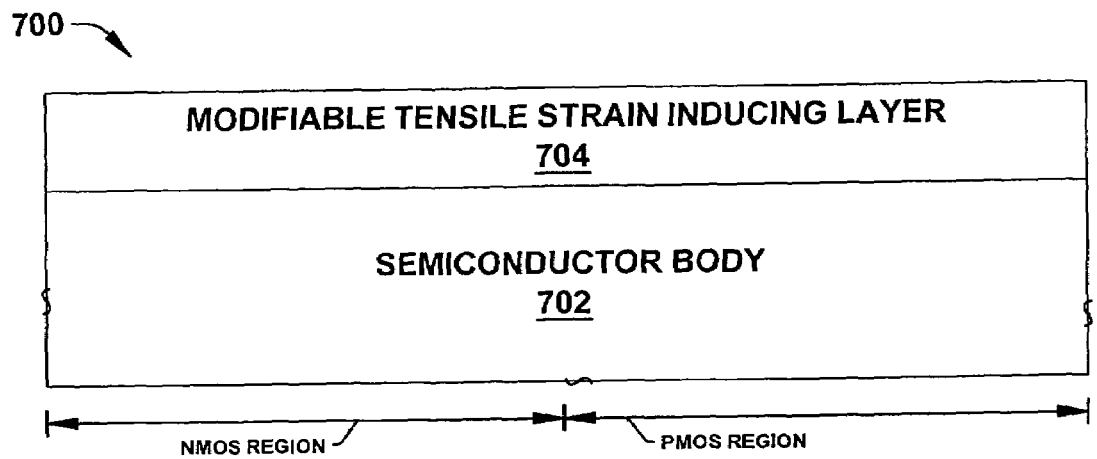
FIGS. 7A to 7D are a plurality of fragmentary cross section diagrams illustrating a semiconductor device formed in accordance with the present invention by the method 600 of FIG. 6.

FIG. 7A is a cross sectional view of the semiconductor device 700 at a stage of fabrication in accordance with an aspect of the present invention. The device 700 includes a semiconductor body 702, which includes at least a portion of a wafer (e.g., a wafer die) and can include one or more layers of semiconductor materials, epitaxial layers, insulator layers, and the like. For example, the semiconductor body 702 herein can include one or more layers of silicon, one or more layers of germanium, silicon on insulator (SOI) material, germanium on insulator (GOI) material, and the like. NMOS and PMOS regions are designated as shown in FIG. 7A.

A modifiable tensile strain inducing layer 704 is formed over the semiconductor body 704 by a suitable formation process at block 606. Generally, the strain inducing layer 704 is comprised of silicon nitride and is formed by a process that causes the deposited or formed silicon nitride to induce strain, typically tensile strain. By varying and/or controlling the formation processes employed and thickness, a desired or selected compression type, typically tensile, and amount of strain are obtained for the NMOS region.

Figure 7B:
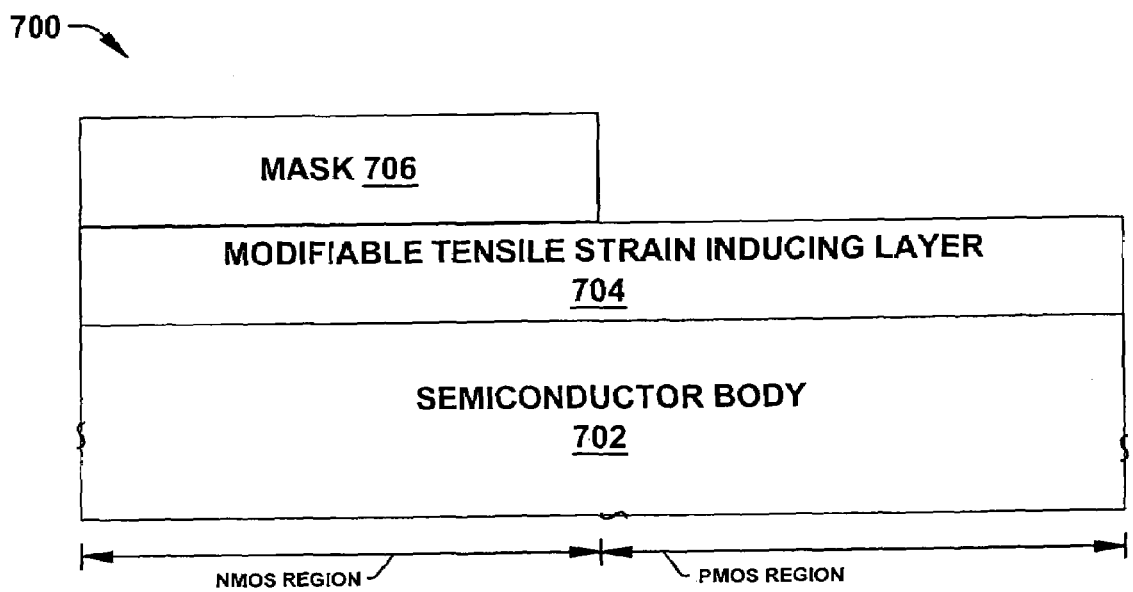

FIG. 7B is a cross sectional view of the semiconductor device 700 at another stage of fabrication in accordance with an aspect of the present invention. A resist mask 706 is formed over the device 700 that exposes the PMOS region and covers the NMOS region. The resist mask 706 can be formed, for example, by depositing photoresist over the device and removing selective portions via development and washing. The resist mask 706 is comprised of a resist material, such as photoresist. However, it is appreciated that masks having other suitable compositions can be employed in place of the resist mask in alternate aspects of the invention.

Figure 7C:
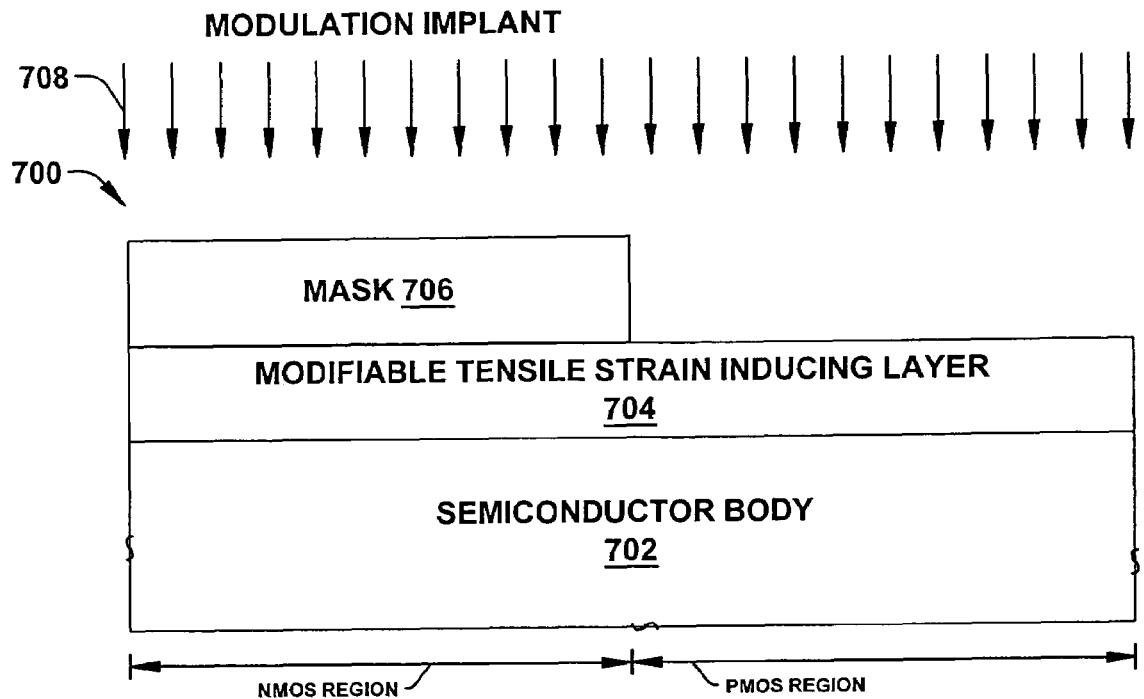

FIG. 7C is a cross sectional view of the semiconductor device 700 at yet another stage of fabrication in accordance with an aspect of the present invention. A selected implant material is implanted into an exposed portion of the strain inducing layer 704 by a modulation implant 708. The implant material is selected according to the formed tensile strain inducing layer and a desired or selected strain type and/or amount. An example of a suitable material is argon, which, when implanted, can alter at least portions of tensile strain inducing layers into compressive strain inducing layers. Other materials, such as inert elements, can also be employed for the implant material.

During the modulation implant 708, the selected material causes the material within the exposed portion of the strain inducing layer within the PMOS region to relax and alter strain type and amount. A dose and energy of the implant 708 also facilitate obtaining the induced compressive strain and amount of the induced compressive strain.

Figure 7D:
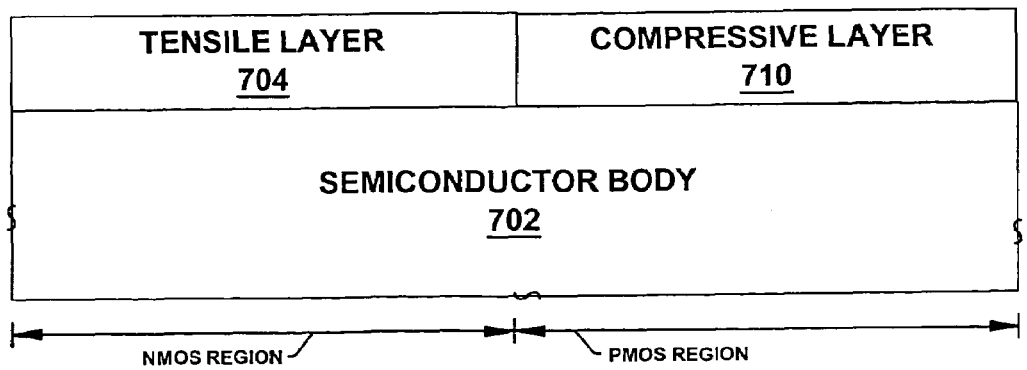

FIG. 7D is a cross sectional view of the semiconductor device 700 at another stage of fabrication in accordance with an aspect of the present invention. After completion of the modulation implant 708 from FIG. 7C and removal of the mask 706, the exposed portion of the strain inducing layer 704 has altered compression type and is now a compressive strain inducing layer 710. Accordingly, the tensile strain inducing layer 704 induces tensile strain throughout the NMOS region and the compressive strain inducing layer 710 induces compressive strain throughout the PMOS region without requiring patterning and separate layer formation.

The previous figures depict and describe formation of a modifiable strain inducing layer. These layers can be formed at various stages of fabrication in order to improve channel mobility, facilitate device operation, permit reduced device size scaling, and the like. In some aspects, the modifiable strain inducing layers are formed and subsequently removed and in others, the modifiable strain inducing layers remain. Two examples of employing modifiable strain inducing layers are described below; however it is appreciated that other fabrication processes can employ the modifiable strain inducing layers of the present invention in various fashions and still be in accordance with the present invention. The provided examples are for illustrative purposes and to facilitate a better understanding of the present invention.

Figure 8:
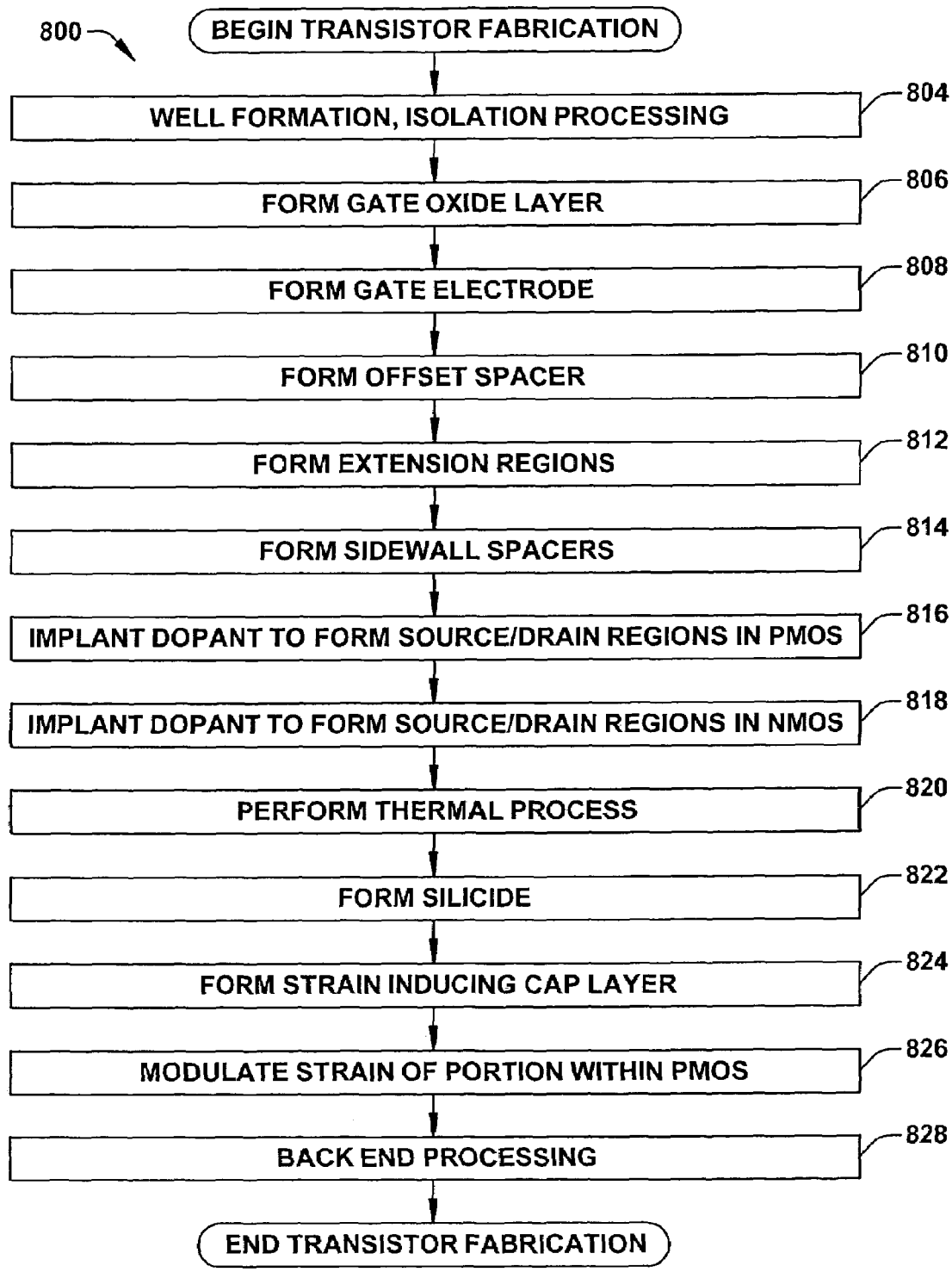
FIG. 8 is a flow diagram illustrating a method of fabricating a semiconductor device that selectively applies tensile strain to an NMOS region and compressive strain to a PMOS region via a single strain inducing layer in accordance with an aspect of the present invention.

FIG. 8 is a flow diagram illustrating a method 800 of fabricating a semiconductor device that selectively applies tensile strain to an NMOS region and compressive strain to a PMOS region in accordance with an aspect of the present invention. The method 800 employs a single cap layer that induces tensile strain, but is selectively modified to yield tensile strain within the NMOS region and compressive strain within the PMOS region.

While the exemplary method 800 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 800 begins with transistor well formation and isolation processing performed at block 804 thereby defining NMOS and PMOS regions. The NMOS regions comprise a P-well in which n-type source/drain regions will later be formed and PMOS regions comprise an N-well in which p-type source/drain regions will later be formed, respectively. In addition, the isolation regions may comprise shallow trench isolation (STI) or field oxide regions (LOCOS) that serve to define various active areas and electrically isolate various active areas laterally from one another.

The method 800 continues at block 806, wherein a gate oxide layer is formed in active areas defined by the various formed isolation regions. In one example, the gate oxide comprises a thin, thermally grown silicon dioxide layer. However, it is appreciated that other type gate dielectrics (such as high-k dielectrics) may be formed and are contemplated by the present invention. A conductive gate layer is then deposited over the gate oxide at block 808 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at block 810. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 812 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Sidewall spacers are then formed on lateral edges of the gate structures at block 814. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Continuing with the method 800, source/drain implants are performed in the PMOS region by employing the resist mask and/or the cap layer as a mask and implanting p-type dopants (e.g., boron) at block 816. The source/drain dopant is introduced into the exposed areas (top of gate electrode and active areas not covered by sidewall spacers).

Similarly, source/drain regions are then formed in the NMOS region by masking the PMOS region with a resist mask, exposing the NMOS region, and implanting n-type dopants (e.g., phosphorous) at block 818. The source/drain dopant is introduced into the exposed areas (top of gate electrode and active areas not covered by the sidewall spacers). A thermal process (e.g., spike anneal, rapid thermal anneal, and the like) is performed at block 820 to activate the dopants.

Continuing, silicide processing is performed at block 822, wherein a refractory metal material is formed over the device, followed by a thermal process, wherein the metal and silicon interfaces react to form a silicide (on top of the gate and in the source/drain regions). Unreacted metal is then stripped away.

A strain inducing cap layer is then formed over the device at block 824. The layer can be formed by depositing silicon nitride via a suitable strain inducing formation process, such as BTBAS. Generally, the strain inducing cap layer is formed to provide a selected amount of tensile strain across the device. Additionally, a composition and thickness of the cap layer are selected to attain a desired amount of strain.

Strain characteristics, including strain type, are modified for a portion of the strain inducing cap layer within the PMOS region at block 826. The strain type is modified by forming a mask that covers the NMOS region and exposes the PMOS region. Thereafter, a selected material is implanted that alters the strain type and strain amount of the exposed portion. Typically, the strain type is altered to be compressive. The selected material can be, for example, an inert material, such as argon, that relaxes the silicon nitride when implanted. Back end processing such as interlayer dielectric and metalization layers are formed at block 828 to conclude the device formation.

It is appreciated that the method 800 is exemplary in nature. Other fabrication methods that employ modifiable strain inducing layers are contemplated by the present invention.

Figure 9A:
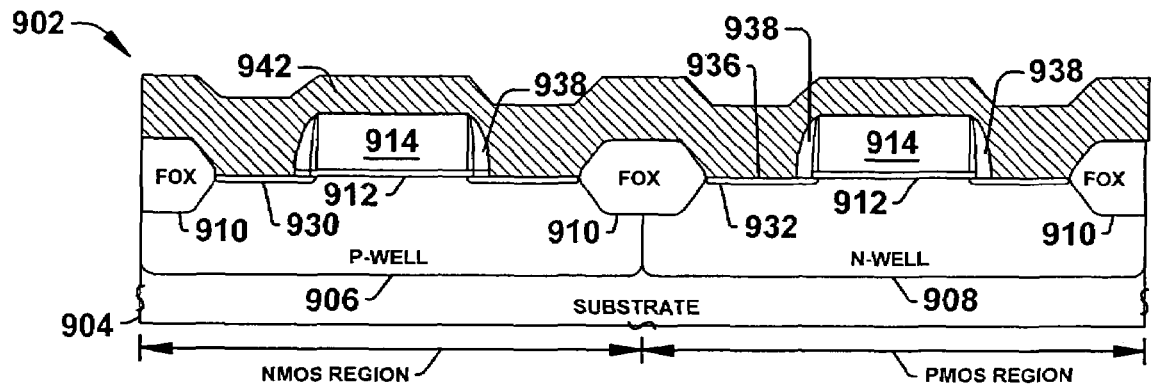
FIGS. 9A and 9B are fragmentary cross section diagrams illustrating a semiconductor transistor device being formed in accordance with an aspect the present invention by the method of FIG. 8.
Figure 9B:
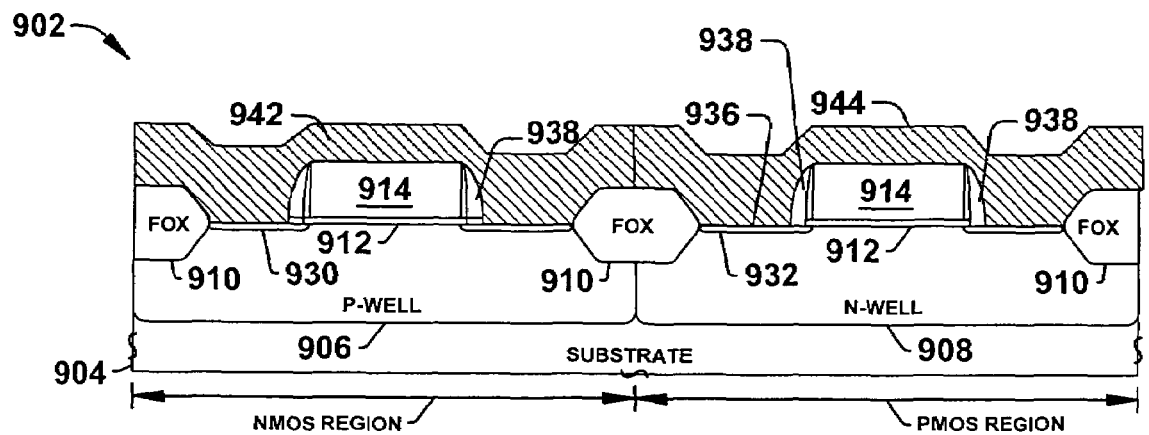

FIGS. 9A and 9B are fragmentary cross section diagrams illustrating a semiconductor transistor device 902 being formed in accordance with an aspect the present invention by the method 800 of FIG. 8. The device 902 is exemplary in nature and it is appreciated that varied devices can also be formed in accordance with the method 800 of FIG. 8 and other methods of the present invention.

In FIG. 9A, a transistor device 902 is provided, wherein a semiconductor body 904 has a number of wells formed therein, such as a P-well 906 to define an NMOS transistor device region and an N-well 908 to define a PMOS transistor device region, respectively. Further, isolation regions 910 such as STI regions are formed in the semiconductor body to define active area regions, as may be appreciated. A gate oxide layer 912 has been formed, for example, by thermally grown SiO2, over the active regions. A conductive gate electrode material (e.g., polysilicon, doped polysilicon, and the like) has been deposited and patterned via an etching process to form gate electrodes 914 overlying the gate oxide 912. Offset spacers 916 are then formed on the lateral edges of the gate electrodes 914. The offset spacers 916 are comprised of an insulative material, such as nitride or oxide, and are relatively thin. The offset spacers 916 operate to protect the gate electrodes 914 and to align and define subsequently formed regions.

N-type extension regions 930 are formed within the NMOS region and p-type extension regions 932 are formed within the PMOS region. A thermal process, such as a rapid thermal anneal, can optionally be performed to activate the implanted dopants, wherein a lateral diffusion of the extension regions 930, 932 under the offset spacers 916 can be achieved.

Sidewall spacers 938 are formed over the offset spacers 916 on the lateral edges of the gate structures as shown in FIG. 9G. To form the sidewall spacers 938, insulating sidewall material(s) are deposited in a generally conformal manner over the device and subsequently subjected to an anisotropic etch to remove the insulating material on top of the gate and over the active areas, leaving sidewall spacers 938 in both the NMOS and PMOS regions, as illustrated in FIG. 9G. Some examples of suitable insulative materials include oxide and nitride.

A strain inducing cap layer 942 is formed over the device 902. The layer 942 can be formed by depositing silicon nitride via a suitable strain inducing formation process, such as BTBAS. Generally, the strain inducing cap layer 942 is formed to provide a selected amount of tensile strain within the NMOS region. Additionally, a composition and thickness of the cap layer are selected to attain a desired amount of strain. At this stage of fabrication, the cap layer 942 induces tensile strain into both the NMOS region and the PMOS region.

FIG. 9B is another cross sectional diagram of the semiconductor device 902. Strain characteristics, including strain type, are modified for a portion of the strain inducing cap layer 942 within the PMOS region to be a compressive strain inducing cap layer 944. The strain type is modified by forming a mask (not shown) that covers the NMOS region and exposes the PMOS region. Thereafter, a selected material is implanted that alters the strain type and strain amount of the exposed portion. Typically, the strain type is altered to be compressive. The selected material can be, for example, an inert material, such as argon, that relaxes the silicon nitride when implanted.

As a result of the strain modification, tensile strain is induced into channel regions within the NMOS region and compressive strain is induced into channel regions within the PMOS region. This is obtained without patterning the strain inducing layer and/or depositing or forming other strain inducing layers.

Subsequent stages of fabrication complete formation of the device 902. The cap layer is removed and source/drain regions are formed within the NMOS and PMOS regions. Silicide regions are then formed on the gate electrodes and source/drain regions.

Figure 10:
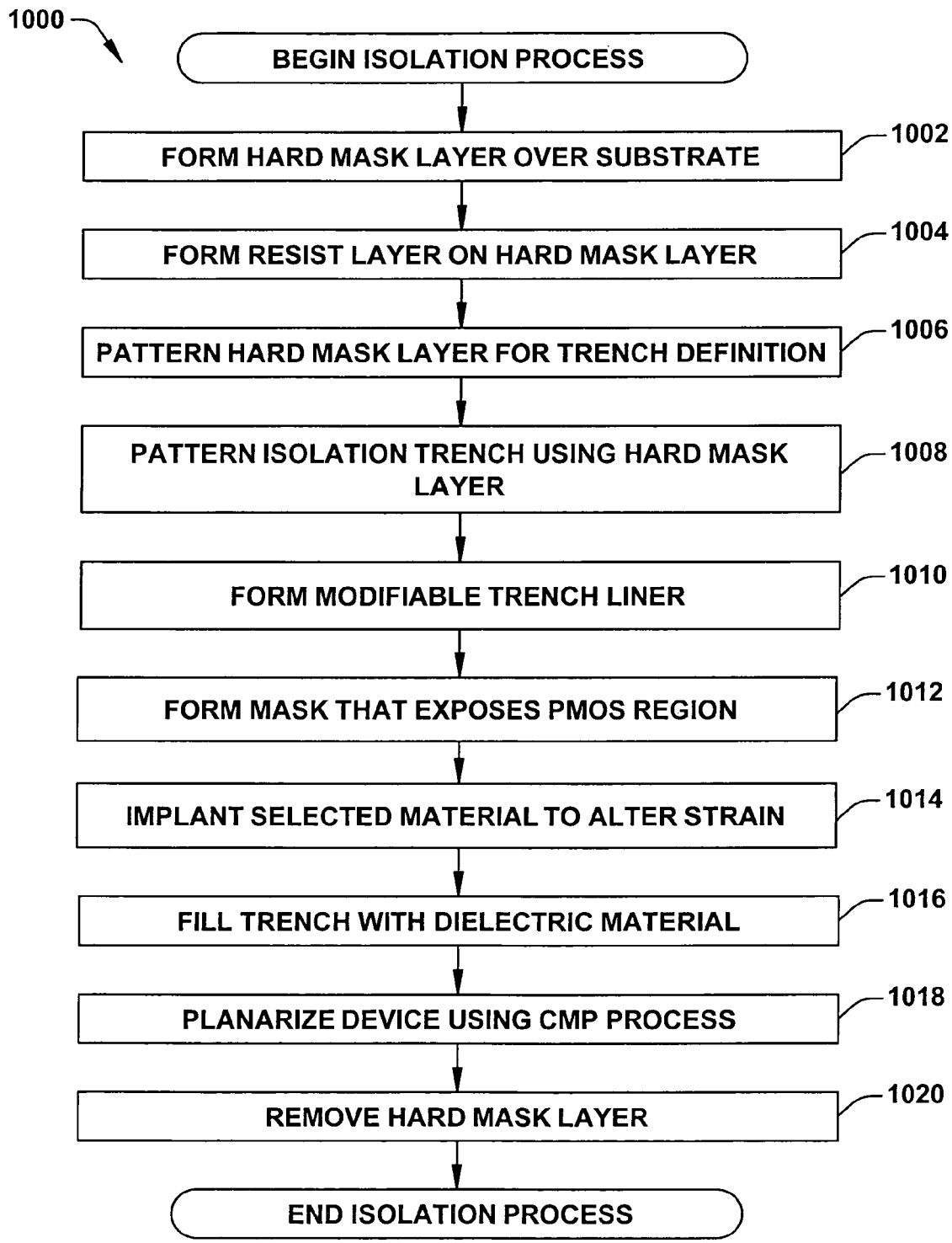
FIG. 10 is a flow diagram illustrating a method for selectively forming a strain inducing trench liner in a semiconductor device in accordance with an aspect of the present invention.

Referring now to FIG. 10, a flow diagram illustrating a method 1000 for selectively forming a strain inducing trench liner in a semiconductor device in accordance with an aspect of the present invention is provided. The strain inducing trench liner can be modified to induce tensile strain within an NMOS region and compressive strain within a PMOS region.

While the method 1000, and other methods according to the invention, are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Beginning at block 1002, a hard mask layer is formed over NMOS and PMOS regions a semiconductor body. The semiconductor body includes at least a portion of a wafer (e.g., a wafer die) and can include one or more layers of semiconductor materials, epitaxial layers, insulator layers, and the like. For example, the semiconductor body herein can include one or more layers of silicon, one or more layers of germanium, silicon on insulator (SOI) material, germanium on insulator (GOI) material, and the like.

A relatively thin pad oxide layer may be formed on the semiconductor substrate prior to formation of the hard mask layer by thermally growing oxide. The hard mask is comprised of a suitable material, such as nitride ($Si_3N_4$) and is deposited, for example, by a low pressure chemical vapor deposition (LPCVD) or other suitable deposition process. The hard mask layer mitigates damage to active regions of the device during formation of isolation regions.

Continuing at block 1004, a resist mask layer is formed over the NMOS and PMOS regions of the device and on the hard mask layer that covers the active regions and exposes isolation regions. A photoresist material is deposited on the hard mask layer and patterned to expose the hard mask layer within the isolation regions and yet remain and cover the hard mask layer within the active regions.

The hard mask layer is then patterned using a suitable etch/patterning process and the resist mask layer as a mask at block 1006 to expose underlying silicon of the isolation regions. The resist layer is then removed by a suitable resist removal process, such as an ashing process.

Subsequently, a trench formation process is performed at block 1008 that etches the exposed portions of the semiconductor body within both the NMOS and PMOS regions to a selected depth, thereby forming trench regions. The etch process employed is typically selective to the material employed in the mask layer and etches into the semiconductor substrate within the exposed isolation regions so as to form the trench region having sidewalls, and a bottom. The width of the insulation trench is associated with the isolation opening(s) in the mask layer.

A number of suitable etch processes can be employed to form the trench regions at block 1008. For example, a dry etch can be employed, which works well with hard mask layers. Additionally, reactive ion etching (RIE) can be employed. For example, a single or multi-step RIE etch process may be performed which removes material in the exposed isolation regions. Other suitable etch processes can also be employed.

A strain inducing liner is formed within the trench regions of both the NMOS and PMOS regions at block 1010. Typically, the strain inducing trench liner is comprised of silicon nitride and is formed by a fabrication process, such as a BTBAS based deposition process, that form the liner inducing a selected type of strain. Generally, the strain inducing trench liner is formed as a tensile strain inducing liner, such as a BTBAS silicon nitride liner.

The strain inducing liner can be formed via a number of suitable processes in order to obtain a desired thickness, strain amount, and strain type. One example of a suitable formation process is using NH3 and di-chloro silane in a furnace or single wafer tool. Such nitride trench liners yield tensile straines of about 900 MPa. Another example of a suitable process is growing the nitride trench liner within a furnace or single wafer tool with BTBAS (bis-tetrabutyl amino silane). Typical liner produced by this process yield tensile straines of about 1.5 GPa. Yet another example of a suitable process employs hexa chloro disilane (HCD) and NH3 to form the nitride trench liner. HCD formed nitride liners typically yield about 1.2 GPa. Other suitable nitride formation process can also be employed.

Continuing at block 1012, a strain mask is formed over the device that covers the NMOS region and exposes the PMOS region. The strain mask is typically formed by photoresist material. However, it is appreciated that the present invention contemplates other types of materials for the strain mask.

Subsequently, a selected material is implanted that alters the strain type and strain amount of the exposed portion of the trench liner at block 1014. Typically, the strain type is altered to be compressive. The selected material can be, for example, an inert material, such as argon, that relaxes the silicon nitride when implanted.

As a result, tensile strain is induced into active regions of the NMOS region and compressive strain is induced into active regions of the PMOS region by a single strain inducing layer. The strain altering of the trench liner at block 1014 permits appropriate and beneficial types of strain to be induced into the NMOS and PMOS regions. Thus, channel mobility for both regions can benefit.

Although not described, it is appreciated that additional trench liners can be formed in the PMOS and/or NMOS regions prior to forming of the strain inducing liner and/or after forming the strain inducing liner.

At 1016, the trench regions within the NMOS and PMOS regions are filled with dielectric material, such as SiO$_2$ or other electrically isolating material, so as to provide electrical isolation between active regions on either sides of the trench regions. The trench filling operation at 1016 may comprise forming or depositing dielectric material over the device to cover the hard mask layer in the active regions and to fill the trenches in the isolation regions thereof. The trench fill material may be deposited at 1016 using any appropriate deposition techniques, for example, such as high density plasma (HDP) oxide deposition, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS).

The device is then planarized at 1018 to expose a portion of the hard mask layer in the active regions, leaving a generally planar upper surface with portions of the hard mask layer and a remaining portion of the fill material in the trench exposed. The remaining hard mask material is stripped or removed at 1020 by a suitable removal process, such as using a wet etch process selective silicon to remove hard mask material and to stop on or before the silicon substrate (e.g., a pad oxide layer can be employed) without damaging the underlying silicon or other semiconductor material in the active regions of the device. The isolation method 1000 then ends. Thereafter, transistors, memory cells, and/or other electrical devices may be formed in the active regions using semiconductor processing techniques as are known.

The fabrication of varying type strain inducing trench liner for the PMOS and NMOS region facilitates channel mobility for both regions. The improved channel mobility is particularly significant for narrow width devices, such as devices less than 200 nm in width.

Referring now to FIGS. 11A to 11K, a semiconductor device formed in accordance with the exemplary method 1000 of FIG. 10 is illustrated at various stages of fabrication. The stages of fabrication are exemplary in nature and are intended to facilitate a better understanding of the present invention. It is noted at this point that the illustrations provided herein are not necessarily drawn to scale, and that the above method 800 may be employed in processing structures other than those illustrated in the following figures, and further that the structures illustrated and described herein may be fabricated according to other techniques.

Figure 11A:
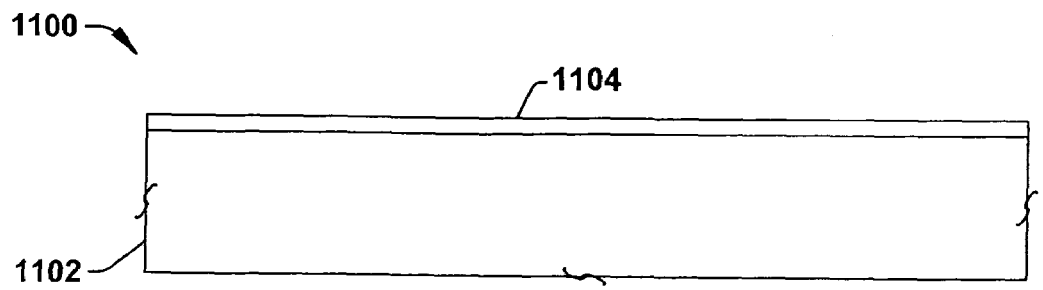
FIGS. 11A to 11K are fragmentary cross section diagrams of a semiconductor device formed in accordance with the exemplary method of FIG. 10.

In FIG. 11A, the semiconductor device 1100 is illustrated comprising a semiconductor body 1102. The semiconductor body includes at least a portion of a wafer (e.g., a wafer die) and can include one or more layers of semiconductor materials, epitaxial layers, insulator layers, and the like. For example, the semiconductor body herein can include one or more layers of silicon, one or more layers of germanium, silicon on insulator (SOI) material, germanium on insulator (GOI) material, and the like. An oxidation process (not shown) is initially employed to grow a pad oxide layer 1104 over the top surface of the substrate 1102 as illustrated in FIG. 11A.

Figure 11B:
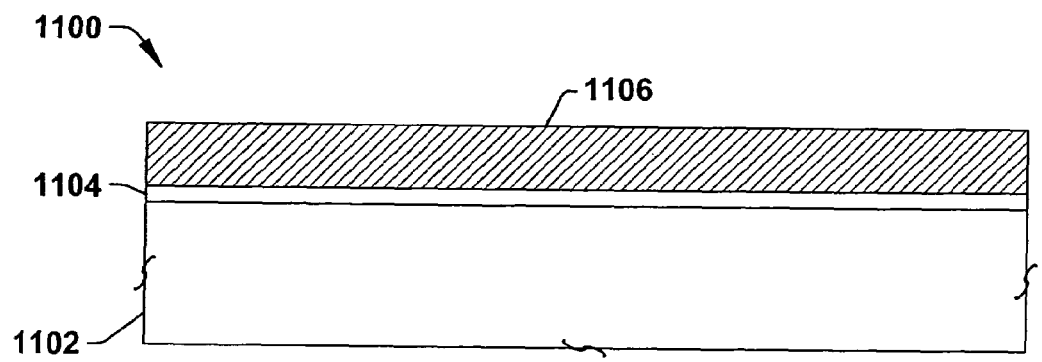

FIG. 11B illustrates a hard mask layer 1106 formed on the pad oxide layer 1104. The hard mask layer 1106 is formed by depositing a hard mask material, such as silicon nitride. An exemplary process for forming the hard mask layer is a low pressure chemical vapor deposition (LPCVD) process of Si$_3$N$_4$. The hard mask layer mitigates damage to active regions of the device during subsequent formation of trench regions and isolation regions.

Figure 11C:
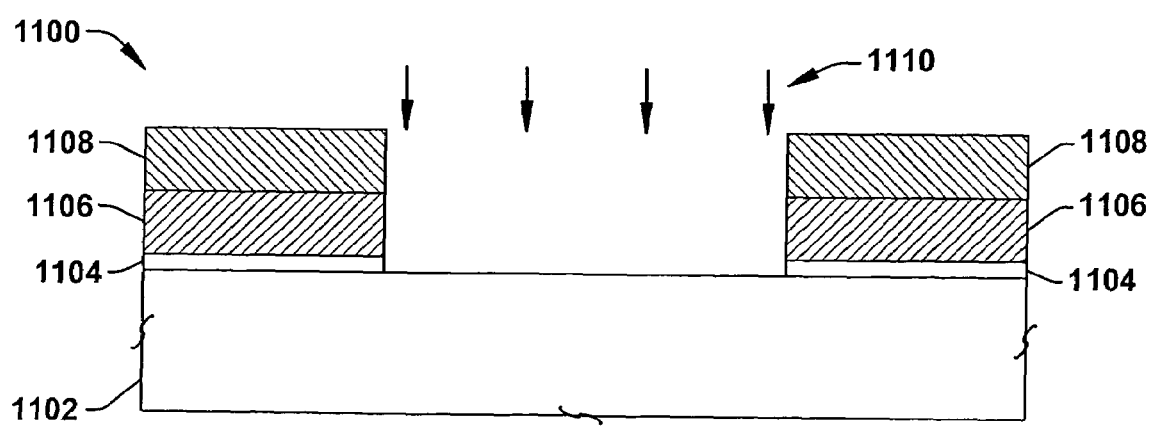

Thereafter, a patterned resist mask 1108 (e.g., a developed photoresist) is formed to cover active regions of the device 1100 while exposing the hard mask layer 1106 in the isolation regions for subsequent trench formation therein. For example, a photoresist material can be deposited on the hard mask layer and then patterned to expose the hard mask layer within targeted isolation regions while remaining on the hard mask layer 1106 within active regions. A dry etch process 1110 is employed in FIG. 11C, in one example, to etch through the hard mask layer 1106 and at least a portion of the pad oxide layer 1104 to substantially expose the semiconductor body associated with the isolation region. FIG. 11C illustrates the device 1100 with the resist mask 1108 and after patterning the hard mask 1106 and the pad oxide 1104.

Alternatively, the etch process 1110 may etch only the hard mask layer 1106 and stop on the pad oxide layer 1104. In yet another alternative, the etch process 1110 may etch all of the exposed hard mask layer 1106 and the underlying pad oxide layer 1104 and land on the underlying semiconductor material. In another example, the etch process 1110 is employed to partially etch the hard mask layer 1106, wherein some portion of hard mask layer remains overlying the isolation regions. In one example, a remaining amount of the hard mask layer 1106 may be about 1,000 Angstroms thick, however, other remaining thicknesses are contemplated by the present invention.

Figure 11D:
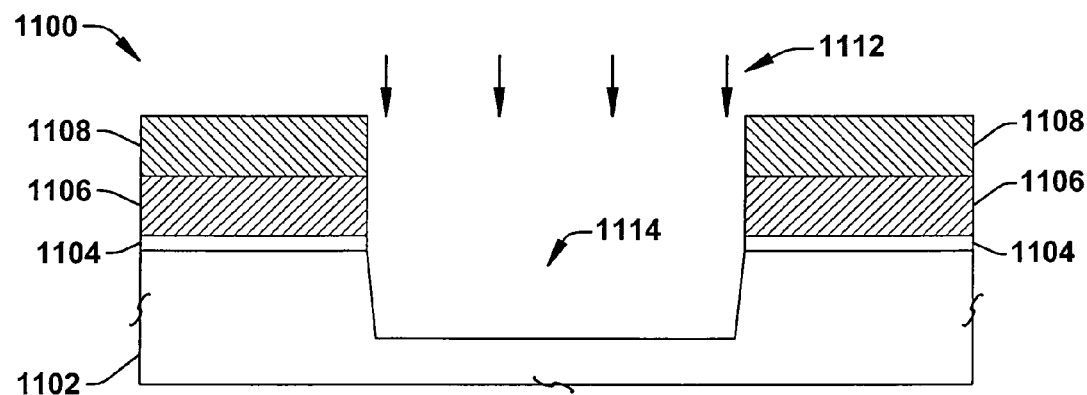
Figure 11E:
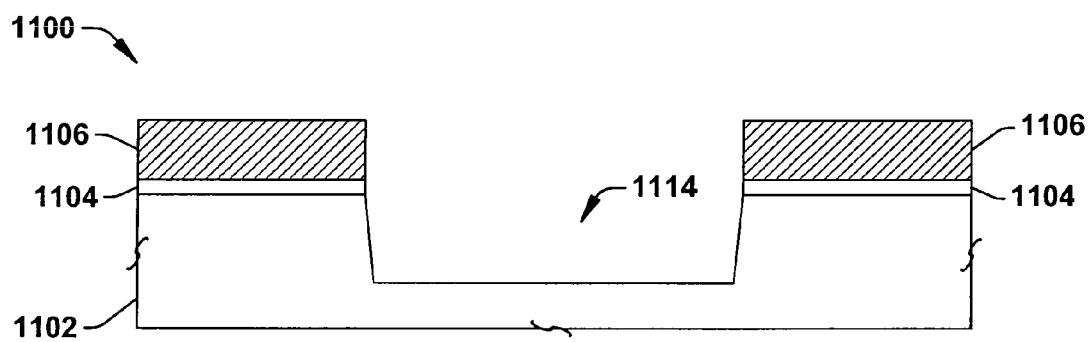

Continuing with respect to FIG. 11D, an etch process 1112 is performed using the resist mask 1108 to form isolation trench regions 1114 to a depth and width in the isolation regions, where the trench regions comprises sidewalls and a bottom. The etch process employed is typically selective to the material employed in the mask layer and etches into the semiconductor substrate within the exposed isolation regions so as to form the trench region having sidewalls, and a bottom. Subsequently, the resist mask 1108 is removed by a suitable process, such as an ashing process yielding the device 1100 as formed in FIG. 11E.

Figure 11F:
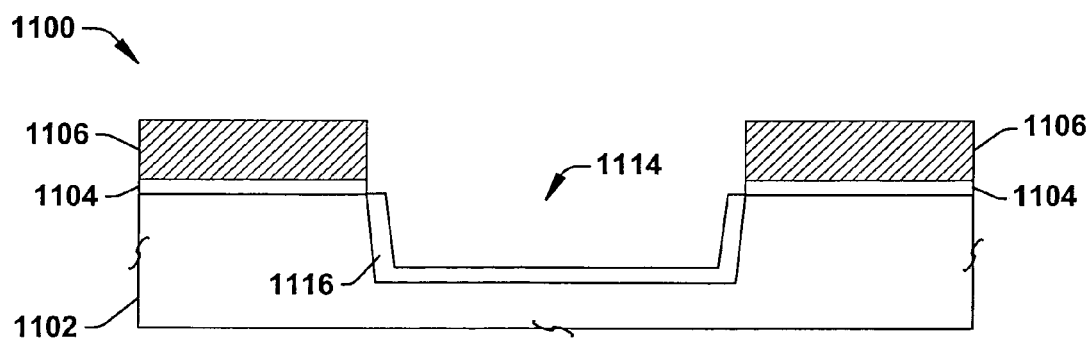

A modifiable strain inducing trench liner 1116 is formed over the semiconductor body by a suitable formation process as shown in FIG. 11F. Generally, the strain inducing liner is comprised of silicon nitride and is formed by a process that causes the deposited or formed silicon nitride to induce strain, typically tensile strain.

Figure 11G:
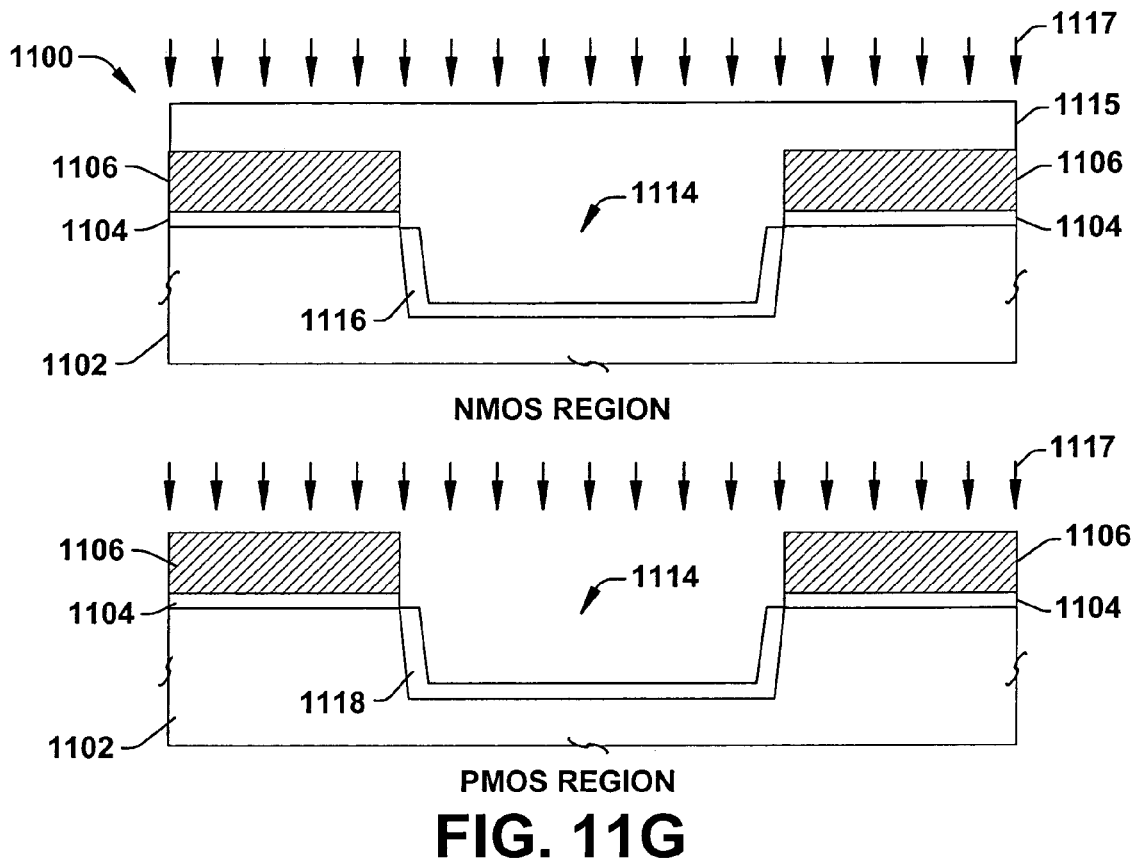

A strain resist mask 1115 is formed over the device as indicated in FIG. 11G. The strain resist mask 1115 exposes the PMOS region, but covers the NMOS region. Subsequently, a selected implant material, such as argon, is implanted via a modulation implant 1117 to alter the strain type and amount of an exposed portion of the strain inducing trench liner 1116. The implant material employed is selected according to the formed strain inducing trench liner and a desired or selected strain type and/or amount for the PMOS region. Other materials that can be employed for the implant material include, for example, inert elements.

Figure 11H:
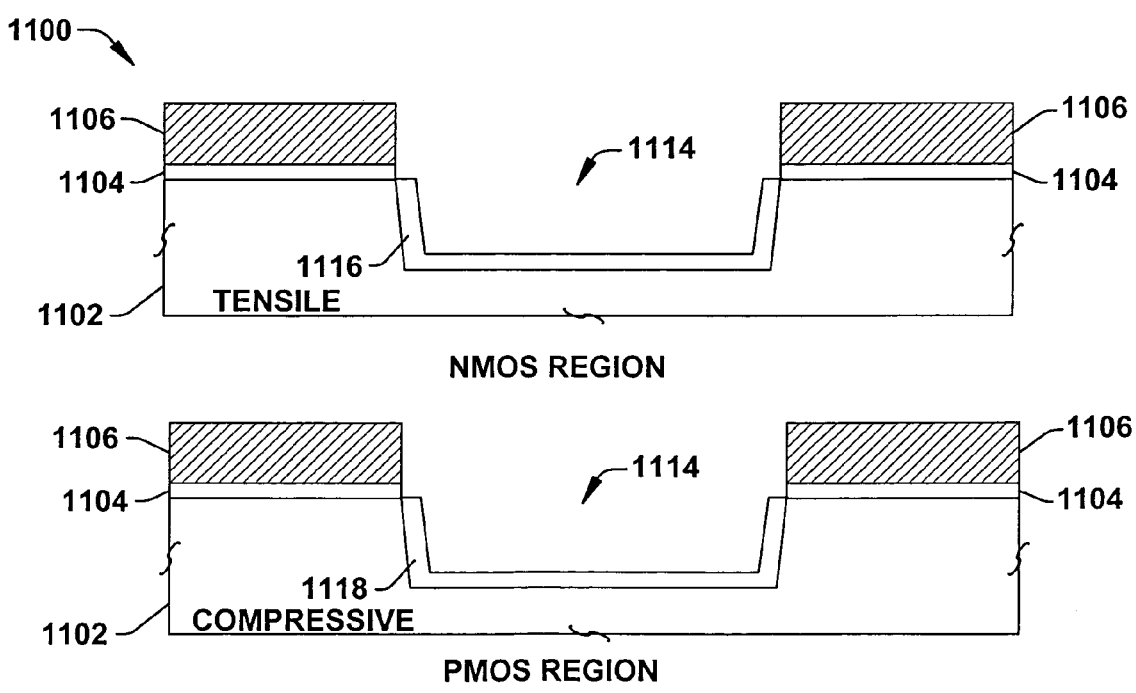

The resist mask 1115 is removed and the modified portion of the trench liner within the PMOS region is converted to a compress strain inducing trench liner 1118 as depicted in FIG. 11H. As a result, the tensile strain inducing trench liner 1116 induces tensile strain into active regions of the NMOS region and the compressive strain inducing trench liner 1118 induces compressive strain into active regions of the PMOS region. Channel mobility and driver current can be improved in both regions due to the selectively induced strain. Additionally, extra patterning and/or depositing processes are avoided and yet varied types of strain are provided.

Figure 11I:
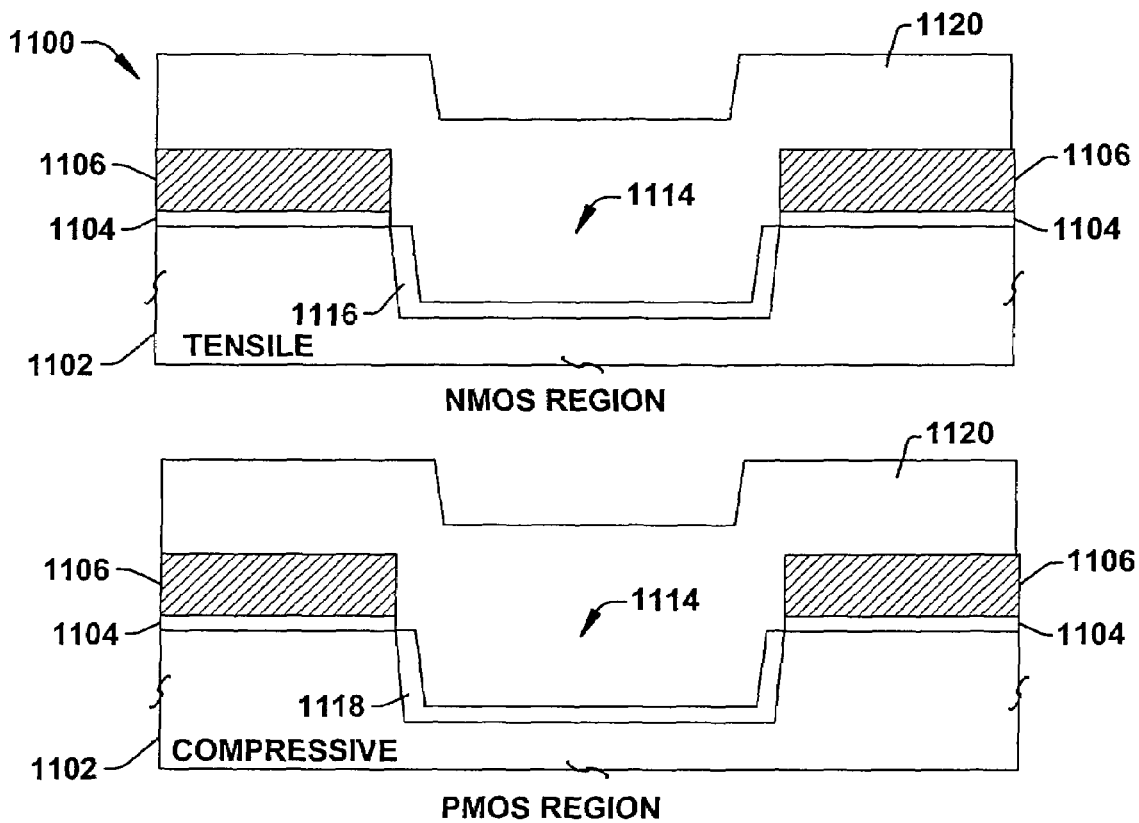

The trench regions 1114 are then filled in with electrically isolating, dielectric material 1120 via a deposition process as shown in FIG. 11I. The process involves a suitable deposition methodology, such as depositing $SiO_2$ or other isolating material using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials and deposition processes are contemplated as falling within the scope of the present invention.

Figure 11J:
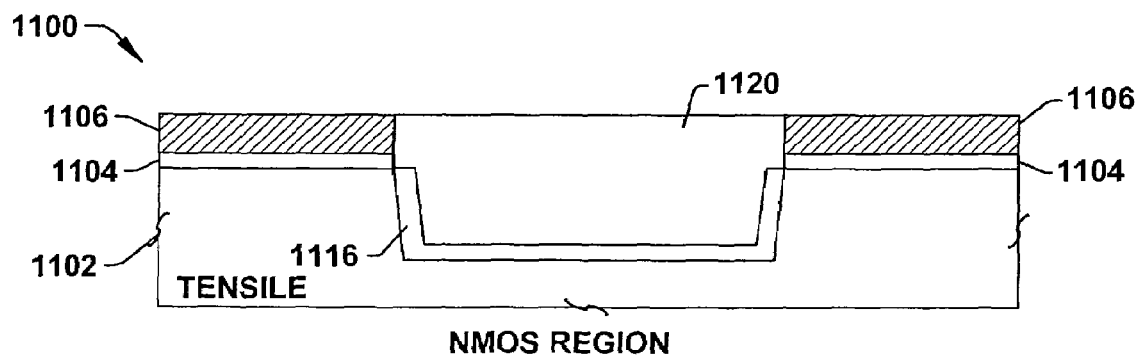
Figure 11J:
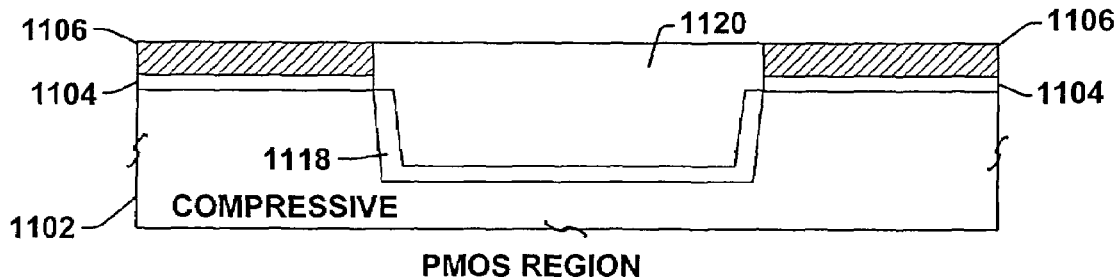
Figure 11K:
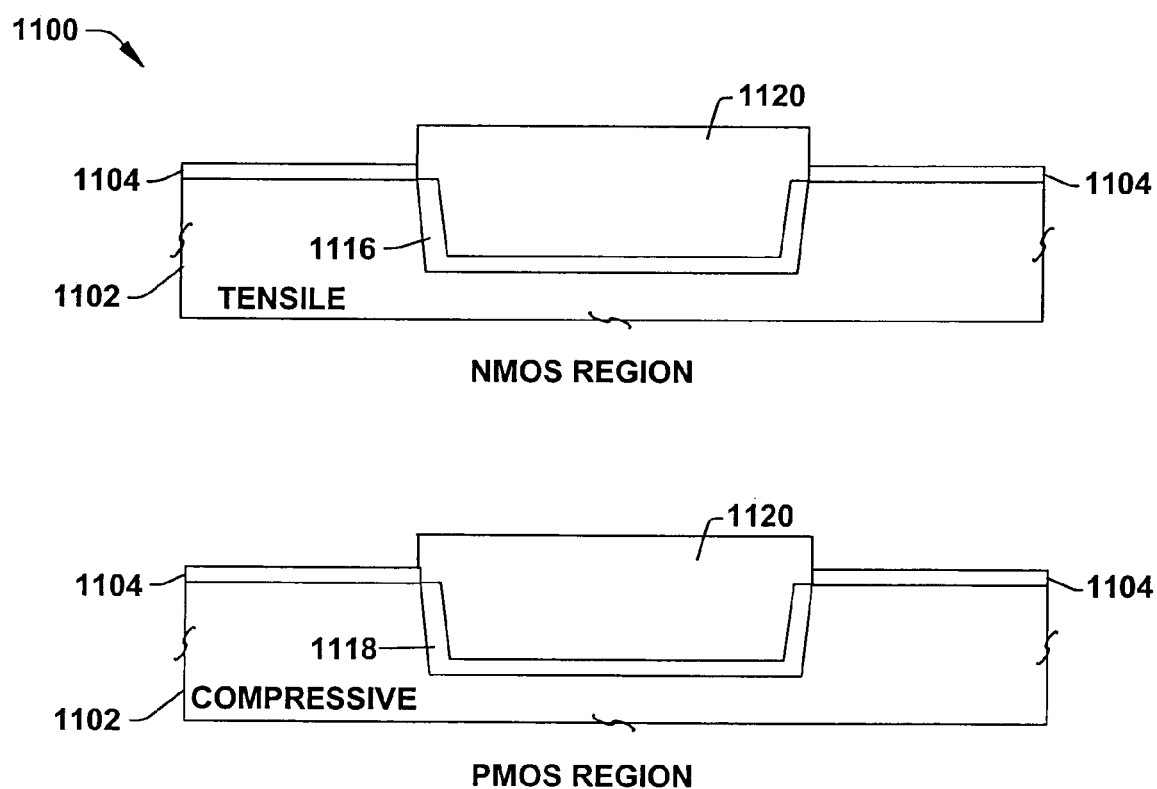

Continuing with FIG. 11J, a planarization process is performed to remove the upper portions of the fill material 1120 as well as upper portions of the hard mask layer 1106, wherein the hard mask layer 1106 serves as a planarization stop. The process can comprise a chemical-mechanical polishing (CMP) process wherein a generally planar upper surface is provided in the device 1100. Subsequently in FIG. 11K, the remainder of the hard mask layer 1106 is stripped or otherwise removed, leaving finished STI isolation structures comprising the trench regions 1114 lined with only the tensile strain inducing trench liner 1116 within the NMOS region and lined with the compressive strain inducing trench liner 1118 within the PMOS region. Additionally, the isolation structures further comprise the filled dielectric material 1120.

Thereafter, transistors, memory cells, and/or other electrical devices (not shown) may be formed in the active regions using semiconductor processing techniques as are known.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a semiconductor device that comprises a strain inducing cap layer, the method comprising:
    forming isolation regions within a semiconductor body and defining active regions of a PMOS region and an NMOS region;
    forming nwell regions within the active regions of the PMOS region and pwell regions within the active regions of the NMOS region;
    forming a gate dielectric layer over active regions within the NMOS and PMOS regions;
    forming a gate electrode layer on the gate dielectric layer;
    patterning the gate electrode layer and the gate dielectric layer to form gate structures in the NMOS and PMOS regions;
    forming a strain inducing cap layer over the device;
    modifying a strain type of a portion of the strain inducing cap layer within the PMOS region; and
    removing the cap layer.

2. The method of claim 1, further comprising forming n-type source drain regions within the pwell regions and p-type source drain regions within the nwell regions.

3. The method of claim 1, wherein the strain inducing cap layer is formed via a silicon nitride deposition that forms the strain inducing cap layer as a tensile strain inducing layer.

4. The method of claim 1, wherein the strain type of the portion of the strain inducing cap layer within the PMOS region is modified from a tensile type to a compressive type.

5. A method of fabricating a semiconductor device comprising a strain inducing trench liner, the method comprising:
    defining isolation regions and active regions in NMOS and PMOS regions of a semiconductor body;
    forming trench regions within the isolation regions in the PMOS and NMOS regions;
    forming a modifiable strain inducing trench liner within the NMOS and PMOS region, wherein the strain inducing trench liner induces tensile strain into the active regions of the NMOS and PMOS region;

forming a mask on the modifiable strain inducing trench liner that exposes the PMOS region; and implanting a selected material that alters a strain type of the modifiable strain inducing trench liner within the PMOS region to a compressive strain.

6. The method of claim 5, further comprising removing the mask and filling the trench regions of the PMOS region and the NMOS region with a dielectric fill material.

7. The method of claim 6, further comprising planarizing the device to remove excess fill material.

8. The method of claim 5, wherein forming the modifiable strain inducing trench liner comprises forming a tensile strain inducing silicon nitride liner.

9. The method of claim 5, wherein the selected material is argon.

* * * * *